(12) United States Patent
Ashby

(10) Patent No.: US 6,734,690 B1
(45) Date of Patent: May 11, 2004

(54) BACK PRESSURE TEST FIXTURE TO ALLOW PROBING OF INTEGRATED CIRCUIT PACKAGE SIGNALS

(75) Inventor: Wayne C. Ashby, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/562,585

(22) Filed: Apr. 29, 2000

(51) Int. Cl.[7] .............................................. G01R 31/02
(52) U.S. Cl. ...................... 324/761; 324/754; 324/758
(58) Field of Search ................... 324/761, 758, 324/754

(56) References Cited

U.S. PATENT DOCUMENTS

| | | | | |
|---|---|---|---|---|
| 4,769,591 A | * | 9/1988 | Binet et al. ................ 324/754 |
| 5,148,103 A | * | 9/1992 | Pasiecznik, Jr. ............ 324/758 |
| 5,264,787 A | * | 11/1993 | Woith et al. ............... 324/758 |
| 5,461,326 A | * | 10/1995 | Woith et al. ............... 324/758 |
| 5,604,446 A | * | 2/1997 | Sano ........................... 324/758 |
| 5,672,977 A | * | 9/1997 | Yamada ...................... 324/754 |
| 5,889,407 A | * | 3/1999 | Nucci ......................... 324/754 |
| 5,990,695 A | * | 11/1999 | Daugherty, Jr. ............ 324/758 |
| 6,252,414 B1 | * | 6/2001 | Boyette, Jr. et al. ....... 327/758 |

* cited by examiner

Primary Examiner—Evan Pert
Assistant Examiner—Jermele M. Hollington

(57) ABSTRACT

A test fixture is disclosed for applying force to the surface of a printed circuit board to maintain proper electrical contact between the printed circuit board and an IC package or other electrical component on the opposite side of the board. The fixture employs a link structure to apply force to the board surface while still allowing access to contact points of interest on the side of the board opposite the IC package.

13 Claims, 3 Drawing Sheets

BACK PRESSURE TEST FIXTURE TO ALLOW PROBING OF INTEGRATED CIRCUIT PACKAGE SIGNALS

TECHNICAL FIELD

The invention relates in general to computer component test equipment, and more particularly to printed circuit board test equipment.

BACKGROUND

When testing computer components on printed circuit boards it is generally desirable to make electrical contact with electrical nodes at particular locations on such printed circuit boards (PCB). Where integrated circuit (IC) packages which have an array of surface contacts are connected to the PCB, electrical contact is most practically made on the side of the board opposite the IC packages, generally employing vias in the board. Herein, the term "board" and "printed circuit board" are generally used interchangeably.

Where IC packages are attached to a board or PCB, an intermediate conductive layer is commonly inserted between the IC packages and the PCB, such as an interposer which includes compression contacts. The compression contacts apply a force against the board, generally causing the board to bow out or bend away from IC package electrical contacts where no restraint is placed on the board. When the board is allowed to bend away from electrical contacts on the IC package, electrical contact between the board and the IC package may be disrupted, thereby disabling proper function of the board and any meaningful diagnostic operation. Accordingly, a back pressure plate or back plate is commonly applied to the side of the PCB opposite the side on which the IC package is attached to prevent such board warpage, thereby ensuring that proper electrical contact is made between the IC package and the board and that proper operation of the equipment on the board as a whole is maintained.

Although installation of the back pressure plate generally solves the problem of the warpage of the PCB while preserving proper function of components interconnected on the PCB, the installation of a plate in this manner generally blocks access to electrical contacts which is needed for testing the operation of the board.

Therefore, it is a problem in the art that, without restraint being applied to PCB, the PCB may bend away from IC packages attached to the PCB causing normal operation of the board to be disrupted and preventing effective diagnosis of the board's function.

It is a further problem in the art that attaching a back plate to the side of a PCB opposite the side on which an IC package is attached generally blocks access to electrical contacts benefical performing testing on the board.

SUMMARY OF THE INVENTION

These and other objects, features and technical advantages are achieved by a system and method which opposes the warpage of a printed circuit board caused by compression contacts or other mechanism disposed between an IC package and a PCB while providing clearance on the side of the PCB opposite a side on which an IC package is attached, thereby providing access to electrical contacts on the circuit board beneficial to performing diagnostic operations on PCB operation. Herein, the term "opposing side" or "opposing surface" generally refers to the side or surface of a PCB opposite to the side of the PCB to which an IC package or other component to be tested is attached.

One approach to providing access to electrical contacts on a PCB for diagnostic purposes involves drilling holes in selected locations on a back pressure plate which is in place to prevent warpage of the PCB. The holes are preferably drilled at locations on the back plate corresponding to locations, on the pertinent side of the PCB, of electrical contacts carrying signals which are of interest to a diagnostic operation. In this manner, even with the back plate firmly secured against the PCB, electrical probes may be inserted through the back plate and make contact with desired locations on the PCT for diagnostic purposes.

A disadvantage which may arise when employing the drilled back pressure plate approach discussed above is that it may be desirable to probe locations on the PCB which are blocked by the back pressure plate. This situation may arise due to a number of circumstances including but not limited to: misalignment between the holes in the back pressure plate and the desired connection locations on the PCB, a change in location of certain desired electrical contact locations on the PCB, between the time when the back pressure plate is designed and machined and the time at which testing is conducted, and a change in the locations on the PCB selected for probing during diagnostic operations. Accordingly, a more flexible approach to opposing warpage of the PCB while still permitting access to electrical contact locations desired for diagnostic purposes is needed.

In a preferred embodiment of the present invention, a mechanism is deployed which opposes warpage in a printed circuit board caused by compression contacts or other device by applying force to an opposing side of a PCB employing one or more selectively located pressure points while exposing electrical contacts on the opposing side of the PCB for attachment of probes for diagnostic purposes.

In a preferred embodiment, a frame may be attached to a PCB. In turn, one or more contact devices may be attached to the frame for applying force to the PCB to oppose warpage of the PCB. The frame could be permanently attached to the PCB or alternatively could be suited for temporary attachment to the PCB during testing or diagnostic operations. Alternatively, the frame could secured in proximity to the PCB through an attachment to a location independent of the PCB.

In a preferred embodiment, the number of contact devices employed to impart force to the PCB may be varied based upon a number of factors, such as, for instance: the size of the PCB, the number locations on the PCB with which electrical contact is sought, and the relative proximity of the desired electrical contact points on the PCB. Moreover, the locations on the PCB at which the one or more contact devices make contact with the PCB may be either variable or fixed. Furthermore, force may be imparted to an opposing side of a PCB employing a number of means including but not limited to: coil spring, electric motor, leaf spring, electromagnetic solenoid, pneumatic pressure, hydraulic pressure. Links disposed above the PCB for imparting force to the PCB may include a range of possible degrees of rigidity.

In a preferred embodiment, the inventive mechanism preferably enables the PCB to be remain substantially straight during testing of the PCB, thereby preferably ensuring proper electrical contact between the PCB and an IC package attached thereto as well as proper operation of the PCB, while simultaneously providing physical access to electrical contact points on the PCB for probes and other devices to enable diagnostic operations to be performed.

Moreover, the inventive mechanism preferably presents the ability to flexibly modify the locations on the PCB to which physical access by electrical probes may be granted. Modifying the locations on the PCB to which access is granted in successive testing setups or attachments preferably enables an entirety of contact points of interest on a PCB surface to be accessed, even if a subset of these contact points is blocked by test fixture equipment during an initial test fixture attachment.

Therefore, it is an advantage of a preferred embodiment of the present invention that the inventive mechanism may operate to oppose warpage of a PCB while providing access on the PCB to electrical probes for diagnostic purposes.

It is a further advantage of a preferred embodiment of the present invention that force may be imparted to a PCB at a selectable set of locations on the PCB, thereby enhancing an ability to access all desired electrical contact locations on the PCB.

It is a still further advantage of a preferred embodiment of the present invention that the points on a PCB to which test equipment may be connected may be varied after testing is under way.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
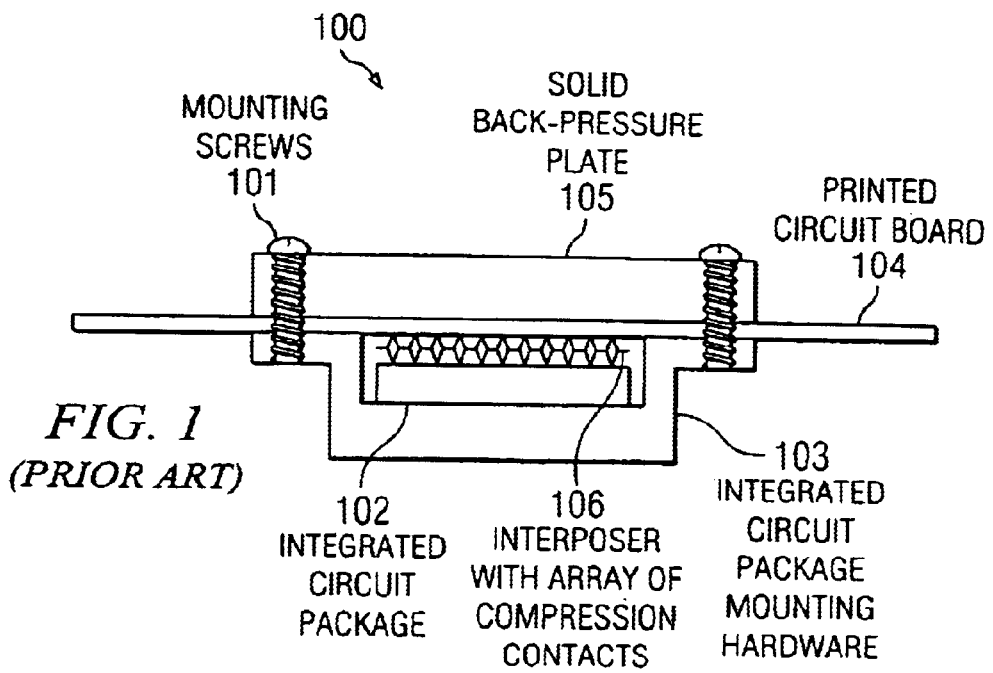
FIG. 1 depicts an attachment of a back pressure plate to a PCB to oppose warpage according to a prior art solution.

FIG. 1 depicts an attachment of a back pressure plate 105 to a PCB 104 to oppose warpage according to a prior art solution. IC package 102 is generally connected to PCB 104 employing IC package mounting hardware 103. An interposer 106 is generally disposed between the IC package 102 and the lower surface (in the view of FIG. 1) of PCB 104. An effect of so disposing interposer 106 is generally to force PCB 104 away from IC package 102 in the vicinity of IC package 102 possibly causing a disruption of electrical contact between IC package 102 and PCB 104 and disabling normal operation of both IC package 102 and PCB 104.

One prior art solution to the problem of PCB 104 warpage is the attachment of back-pressure plate 105 to the upper surface of PCB 104. While attaching plate 105 to PCB 104 generally succeeds in opposing warpage of PCB 104 and ensuring that proper electrical contact is maintained between PCB 104 and IC package 102, plate 105 generally completely blocks access to the upper surface (in the view of FIG. 1) of PCB 104. Accordingly, access to vias (not shown) penetrating PCB 104 for the purpose of conducting diagnostic tests or other purpose is generally not possible because of the presence of plate 105.

Figure 2:
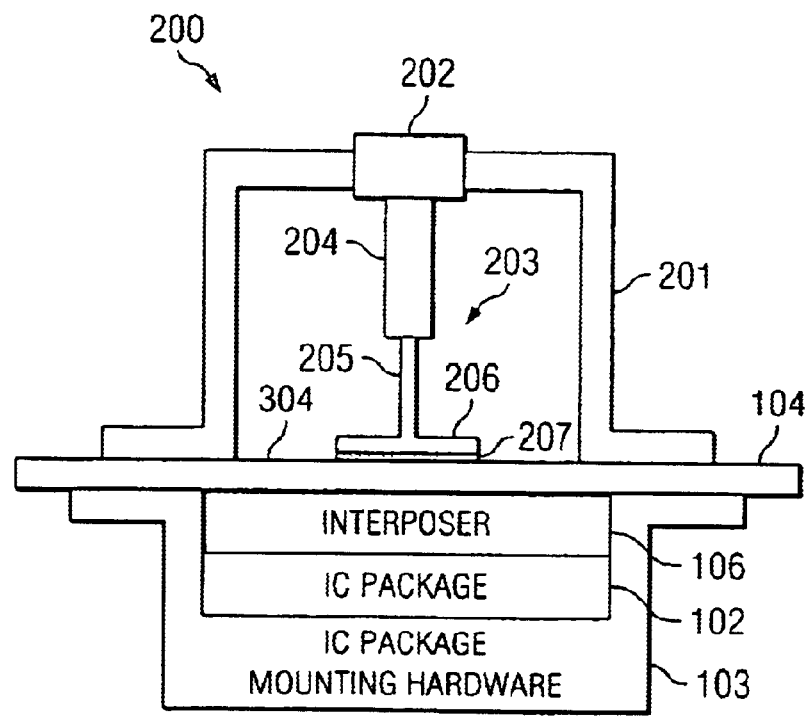
FIG. 2 depicts a test fixture for imparting force to a PCB according to a preferred embodiment of the present invention.

FIG. 2 depicts a test fixture 200 for imparting force to a PCB 104 according to a preferred embodiment of the present invention. Generally, in the arrangement of FIG. 2, the compression contacts of an interposer 106 disposed between IC package 102 and PCB 104 applies a upward force ("upward" in the view of FIG. 2) against PCB 104 as discussed in connection with FIG. 1 above. This application of upward force upon PCB 104 generally causes PCB 104 to warp away from contacts in interposer 106, thereby disrupting electrical contact between IC package 102 and PCB 104 and disrupting normal operation of IC package 102 and PCB 104. Preferably, the inventive test fixture operates to oppose this upward force while still providing access to points of interest on and/or near the upper surface of PCB 104 for diagnostic or other equipment. The previously referred to "points of interest" may be vias, in communication with IC package 102, which vias are accessible on the upper surface of PCB 104. The vias preferably provide electrical access to IC package 102 from the upper surface of the board. It will be appreciated that conductive mechanisms other than vias may be employed to provide such electrical access to IC package 102 including but not limited to conductive traces, metal rods, and internal PCB wiring, and that all such variations are included within the scope of the present invention.

It will be appreciated that components other than IC package 102 may be attached to PCB 104 for either diagnostic or other purposes and remain within the scope of the present invention. It will be further appreciated that a number of different diagnostic operations may be conducted including but not limited to: analog electrical testing, digital communication, thermal testing, and mechanical vibration testing, and that all such variations are included within the scope of the present invention.

In a preferred embodiment, a frame 201 is affixed to PCB 104 which includes means for attaching one or more compression links 203 for applying force to the opposing surface or upper surface of PCB 104 to counteract the upward force on PCB 104 applied by interposer 106. The compression links preferably extend from frame 201 to the upper surface of PCB 104. The means for attachment of the compression links are preferably varied depending on the type of compression link employed.

In a preferred embodiment, compression link attachment mechanism 202 enables attachment of compression link 203 to frame 201 thereby providing support for compression link 203's application of force to PCB 104. In the view of FIG. 2, compression link 203 preferably operates to transmit force from frame 201 to PCB 104, thereby preferably operating to counteract buckling or warping of PCB 104 in response to upward force applied to PCB 104 by interposer 106 compression contacts. It will be appreciated that compression link 203 is not limited to applying force in a vertical direction. The above references to a downward application of force are applicable to FIG. 2 because of the way FIG. 2 is drawn and not because of any limitation in the orientation in which compression link 203 may be used.

In a preferred embodiment, compression link 203 includes compression mechanism 204, link extension 205, and base 206. Base 206 preferably includes an insulating layer 207 affixed to its bottom surface to avoid contacting PCB 104 with conductive material. Compression link 203 generally operates to apply force to PCB 104 to at least substantially straighten PCB 104, thereby enabling proper operation of IC package 102 or other component attached to PCB 104.

The operation of compression link 203 may be accomplished employing a range of different force generating mechanisms, numbers of links, geometries and materials. It will be further appreciated that a plurality of compression links 203 may be attached to any one frame 201 and that a plurality of different frames may be attached to any one PCB 104 at any given time.

In a preferred embodiment, compression mechanism 204 operates to provide motion to link extension 205 with sufficient force to substantially straighten PCB 104 in the vicinity of IC package 102. Compression mechanism 204 may employ means for imparting motion and force which include but is not limited to: a screw turned in a threaded hole turned either manually or automatically, a coil spring, an electric motor attached to a suitable advancement mechanism, electromagnetic solenoid, pneumatic cylinder, and a hydraulic cylinder, and all such variations are included within the scope of the present invention. It will be appreciated that two or more of the above means may be combined in a single compression mechanism. Compression mechanism 204 is preferably controlled so as to avoid reaching a force level which may damage PCB 104, and to controllably advance one or more link extensions 205 in contact with PCB 104 so that PCB 104 is appropriately straightened.

In a preferred embodiment, one or more link extensions 205 are attached to compression mechanism 204 and operate to transmit motion and force generated by compression mechanism 204 through base 206 to PCB 104. Link extension 205 is preferably straight and rigid so as to provide for a simple design and to accurately reproduce at PCB 104 the force and motion imparted to link extension 205 by compression mechanism 204. Alternatively, however, link extension 205 may incorporate a range of different shapes and degrees of rigidity. For example, link extension 205 may be a coil spring or other compressible entity which enables force to be increased gradually with gradual advancement of compression mechanism 204. It will be appreciated that all of frame 201, attachment mechanism 202, compression mechanism 204, link extension 205, and base 206 may be composed of a range of different materials, including a range of metals, and plastics, and that all such variations are included within the scope of the present invention. The insulating layer 207 is preferably composed of electrically non-conductive material, such as, for instance, plastic or rubber.

In a preferred embodiment, link extension 205 terminates at a base 206 which applies force to PCB 104. An insulating layer 207 is preferably disposed at the bottom of base 206. In this manner, undesired contact between PCB 104 and external conductive material is preferably avoided. Base 206 is preferably round but may be provided with any other shape. The dimensions of base 206 are preferably selected so as to be large enough to avoid applying excessive pressure (force per unit of area) against any portion of PCB 104 and small enough to avoid obstructing an excessive region on the upper surface of PCB 104. It will be appreciated that base 206 may incorporate a range of dimensions, and all such variations are included within the scope of the present invention.

Figure 3:
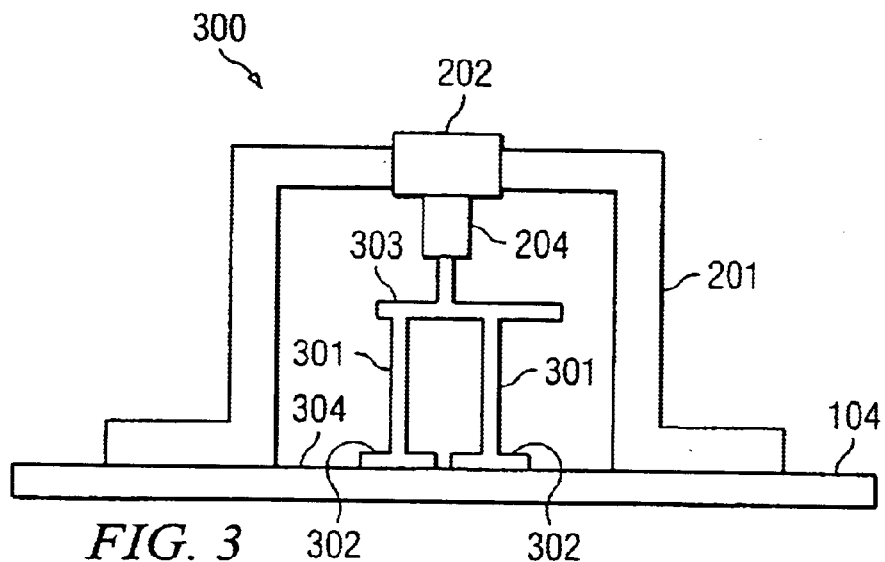
FIG. 3 depicts an alternative embodiment of the inventive test fixture incorporating a plurality of link extensions according to a preferred embodiment of the present invention.

FIG. 3 depicts an alternative embodiment of the inventive mechanism incorporating a plurality of link extensions 301 according to a preferred embodiment of the present invention. For the sake of simplicity, the interposer 106, IC package 102 and IC package mounting hardware 103 are not shown in FIG. 3, as FIG. 3 is directed toward a variation in the deployment of link extensions.

An advantageous feature of the present invention is the provision of access to points of interest on and near the upper surface of PCB 104 for diagnostic and other operations. However, although the embodiment of FIG. 2 provides access to the vast majority of the region on the upper surface of PCB 104 opposite the attachment of IC package 102, there remains the possibility that base 206 may be placed over a point of interest on PCB 104 to which access is desired.

In the embodiment of FIG. 3, an alternative deployment of link extensions is presented which may either used alone or interchangeably with link extension 205 depicted in FIG. 2. In the alternative embodiment of FIG. 3, compression mechanism 204 applies force to two link attachments 301, which in turn apply force to PCB 104 to straighten PCB 104. Preferably, the bases 302 of link attachments 301 are positioned and dimensioned such that a region covered by base 206 of FIG. 2 is uncovered and accessible to diagnostic or other equipment when employing the link extension embodiment depicted in FIG. 3. In this manner, the use of link extension 205 (FIG. 2) and link extension assembly 303 in successive stages of operation of the inventive fixture, for straightening of PCB 104, preferably operates to provide access to an entirety of a region of interest 304 (FIGS. 2–4) of the upper surface of PCB 104. Operation as described above could be achieved by successively attaching link 205 and then link extension assembly 303 to the same compression mechanism 204. Alternatively, a succession of frames 201 having equipment attached to them as depicted in FIGS. 2 and 3 respectively, could be attached successively to the same location on PCB 104.

One alternative approach to providing variation in the area accessible to diagnostic equipment on the upper surface of PCB 104 includes providing an attachment mechanism 202 which is moveable with respect to frame 201 and/or moveable attachment means between frame 201 and PCB 104. One moveable attachment means is a slotted attachment having a nut and bolt arrangement for temporarily establishing a fixed, rigid attachment. In a preferred embodiment, frame 201 has an arched shape as depicted in FIGS. 2 and 3. Alternatively, frame 201 could have a range of different shapes and remain within the scope of the present invention.

Although this disclosure has been directed thus far to a frame which is temporarily attached to PCB 104, it will be apparent to those of skill in the art that a permanent fixture could be attached to the upper surfaced of PCB 104 employing the inventive principles disclosed herein.

Figure 4:
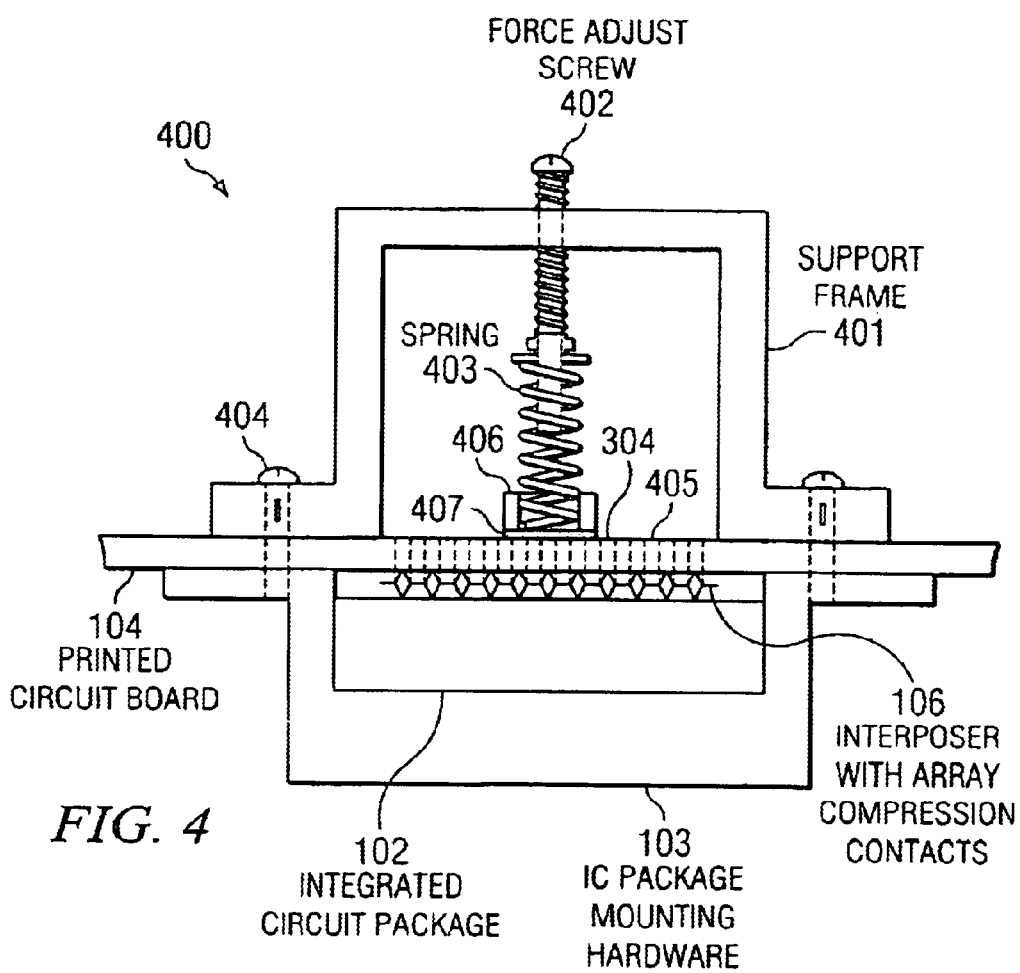
FIG. 4 depicts a test fixture employing a threaded screw-based compression mechanism according to a preferred embodiment of the present invention.

FIG. 4 depicts a test fixture employing a screw based compression mechanism according to a preferred embodiment of the present invention. More specific implementations of the compression link, compression mechanism, and link extension discussed in connection with FIG. 2 are described in connection with FIG. 4.

In a preferred embodiment, frame 401 is attached to PCB 104 and preferably includes at least one threaded hole through frame 401 for insertion of at least one force adjustment screw 402. Frame 401 is shown attached to PCB 104 with mounting screws. However, frame 401 could be affixed to PCB 104 employing a wide range of attachment means including but not limited to clamps, clips, suction cups, and magnetic force.

In a preferred embodiment, screw 402, spring 403, and base 406 having insulator (or insulating layer) 407 cooperate to apply a force against the upper surface of PCB 104 to counteract the force applied to the lower surface of PCB 104 by interposer 106. Base 406 preferably includes an evacuated portion for receiving a bottom end of spring 403. In order to avoid providing any undesired conductance between contacts on the upper surface of PCB 104, insulator or insulating layer 407 is preferably inserted between base 406 and PCB 104. In light of the description in FIG. 2, the combination of screw 402, spring 403, and base 406 with insulating layer 407 generally corresponds to a specific embodiment of a compression link 203 discussed in connection with FIG. 2. Screw 402 generally corresponds to a specific embodiment of compression mechanism 205 discussed in connection with FIG. 2, and spring 403 generally corresponds to a specific embodiment of link extension 205.

In a preferred embodiment, screw 402 is preferably in a substantially retracted position when frame 401 is initially attached to PCB 104 in order to avoid applying excessive force against PCB 104 upon attachment of frame 401. Before force adjustment screw is advanced so as to straighten PCB 104, PCB 104 will generally be warped away from IC package 102 because of upward force applied to PCB 104 by interposer 106. Accordingly, once frame 401 is firmly secured into position, screw 402 may be gradually advanced to as to gradually increase the force applied by spring 403 to straighten PCB 104. The linear distance by which screw 402 will be advanced in order to sufficiently straighten PCB 104 will generally depend upon several factors including the amount of upward force applied against PCB 104 by interposer 106 and the stiffness, or force constant of spring 403. Once an initial screw 402 position and associated spring 403 force are established, the spring force may be modified by selectively advancing or retracting screw 402 by a desired amount.

In a preferred embodiment, a plurality of vias 405 extend through PCB 104 enabling electrical contact (and optionally, thermal contact) to be established between IC package 102 or other component, and diagnostic or other equipment disposed above the upper surface of PCB 104. In the cutaway view of FIG. 4, a plurality of vias 405 are depicted, the majority of which remain accessible to diagnostic equipment (not shown) even after contact between base 406 and PCB 104 is firmly established. The inventive test fixture thereby presents the advantage of being able to access electrical contact with the IC package 102 and simultaneously provide for straightening of PCB 104. As for the base discussed in connection with FIG. 2, the shape of base 406 is variable and has a size which preferably represents a compromise between two competing considerations, the first of which is to minimize the number of vias and other points of interest on the upper surface of PCB 104 which are obstructed by base 406, and the second of which is to avoid applying excessive pressure (measured in force per unit of area) to any portion of PCB 104. Generally, the first consideration listed above operates to encourage reducing the size of base 406 while the second consideration operates to encourage increasing the size of base 406 A range of base dimensions may be selected which substantially satisfy both of the above considerations. Although base 406 is preferably made of Aluminum, a range of other metallic and non-metallic materials may be employed, and all such variations are within the scope of the present invention.

Although one particular embodiment of the inventive test fixture is depicted in FIG. 4, numerous variations will be apparent to those of skill in the art. The number of bases 406 employed to apply force to the upper layer of PCB 104 is not limited to one, but may be varied to suit the needs of a particular application. Any number of bases 406 could be employed. The provision of a plurality of bases 406 may be accomplished by attaching a plurality of coil spring or other link extension mechanisms to screw 402 with each such coil spring attached to a base 406. Alternatively or additionally, a plate may be attached to the bottom end of one or more coil springs 403 to which a plurality of links terminating in bases 406 may be attached, thereby employing a single coil spring to apply force through a plurality of bases.

In a preferred embodiment, an assembly which includes the screw 402, spring 403, base 406, and insulator 407 (hereafter the "link assembly") may be connected to frame 401 so as to enable the link assembly to be intermittently moved with respect to PCB 104. This feature would preferably provide the beneficial effect of varying the areas on PCB 104 which are accessible to diagnostic or other equipment. Such mobility could achieved by attaching the link assembly to one or more slotted connections on frame 401 permitting the attachment of the link assembly to be varied in one or more dimensions. In the event that a via 405 or other point of interest on PCB 104 is covered by base 406 in the base's initial position, the link assembly could be subsequently reattached so as to provide access to the previously inaccessible via.

Figure 5:
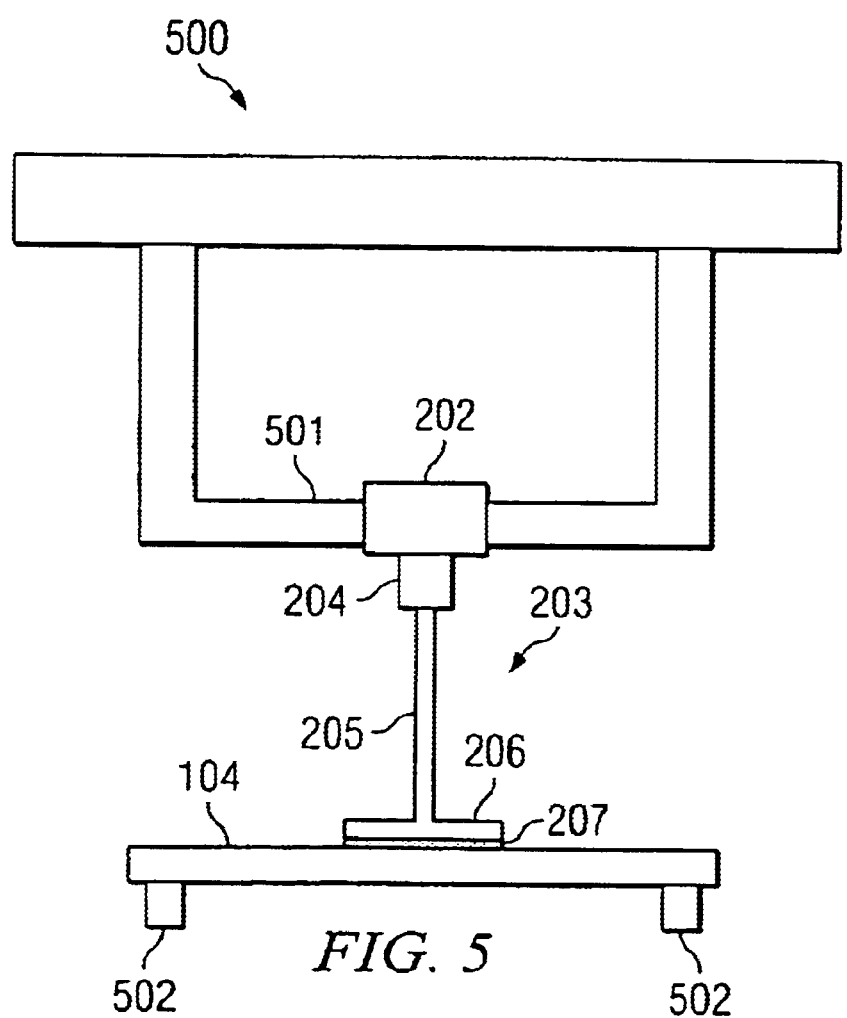
FIG. 5 depicts a test fixture according to an alternative embodiment of the present invention.

FIG. 5 depicts a test fixture 500 according to an alternative embodiment of the present invention. As in FIG. 2, FIG. 5 depicts compression link 203 which preferably includes compression mechanism 204, link extension 205, base 206, and insulator 207. In this alternative embodiment, compression link 203 is attached to frame 501 which is attached to equipment which is preferably mechanically independent of PCB 104.

In the embodiment of FIG. 5, compression link 203 is preferably attached to frame 501 employing attachment mechanism 202. Frame 501 may be moved over PCB 104 in preparation for an application of force to PCB 104 to straighten PCB 104. PCB 104 is preferably supported from below by structural supports 502, or an alternative support structure, to help assure that PCB 104 as a whole is not pushed downward by the application of downward force on PCB 104 by compression link 203. In this embodiment, there is generally no need to secure frame 501 to PCB 104, thereby saving both time and effort in connection with each diagnostic operation.

Frame 501 may be positioned above PCB 104 by a variety of means including but not limited to a gantry device, robotic arm, and clamping at a dedicated work station (not shown). In addition to structural supports 502, clamping may optionally be provided to secure PCB 104 in place during an application of force by compression link 203. For the sake of brevity, the interposer, IC package, and IC package mounting hardware are not shown in FIG. 5, however, these devices would be positioned with respect to PCB 104 in the embodiment of FIG. 5 much as they are shown in FIG. 2.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test fixture for providing access to contacts within a region of interest on a first surface of a circuit board capable of receiving an integrated circuit, the test fixture comprising:

a frame disposed in proximity to said circuit board;

at least one compression link extending from said frame to said first surface of said circuit board; and at least one contact surface at a base of each compression link of said at least one compression link for contacting said first surface of said circuit board, wherein said at least one contact surface allows for access to said contacts within said region of interest.

2. The test fixture of claim 1 wherein said base comprises an insulating layer.

3. The test fixture of claim 1 wherein said at least one contact surface of said compression link is substantially centered with respect to said region of interest on said first surface of said circuit board.

4. The test fixture of claim 1 wherein the region of interest on said first surface of said circuit board is located opposite a region of attachment of an integrated chip package on a second surface of said circuit board.

5. The test fixture of claim 1 wherein the compression link comprises:

one compression mechanism; and a plurality of link extensions coupled to said one compression mechanism.

6. The test fixture of claim 1 wherein said frame is connected to said circuit board.

7. The test fixture of claim 1 wherein said frame is connected to a structure which is mechanically independent of said circuit board.

8. The test fixture of claim 1 further comprising:

an adjustable mount disposed between said frame and said compression link for enabling said compression link to be moved with respect to said frame and to said first surface of said circuit board, thereby enabling an entirety of said region of interest to be accessed employing a sequence of settings of said adjustable mount.

9. The test fixture of claim 1 wherein the compression link comprises:

a compression mechanism attached to said frame for generating force;

a link extension coupled to said compression mechanism for transmitting said generated force to said first surface of said circuit board.

10. The test fixture of claim 9 wherein the compression mechanism comprises:

a force adjustment screw movable through a threaded hole in said frame.

11. The test fixture of claim 9 wherein the link extension comprises:

a coil spring coupled to said compression mechanism at a first end of said coil spring and to said base of said compression link at a second end of said coil spring.

12. The test fixture of claim 9 wherein the link extension comprises:

a rigid member coupled to said compression mechanism and to said base of said compression link.

13. The test fixture of claim 9 wherein the compression mechanism comprises:

a pneumatically actuated cylinder.

* * * * *